US007075091B2

(12) United States Patent  
Hoffman

(10) Patent No.: US 7,075,091 B2  
(45) Date of Patent: Jul. 11, 2006

(54) APPARATUS FOR DETECTING IONIZING RADIATION

(75) Inventor: David Michael Hoffman, New Berlin, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 64 days.

(21) Appl. No.: 10/707,984

(22) Filed: Jan. 29, 2004

(65) Prior Publication Data

US 2005/0167603 A1    Aug. 4, 2005

(51) Int. Cl.
- G01T 1/20 (2006.01)
- G01T 1/24 (2006.01)
- H01L 25/00 (2006.01)
- H01L 27/00 (2006.01)
- H01L 27/146 (2006.01)
- H05G 1/64 (2006.01)

(52) U.S. Cl. ............................ 250/370.11; 250/370.09; 378/98.8

(58) Field of Classification Search ............. 250/208.1, 250/215, 361 R, 366, 369, 370.01–370.03, 250/370.05, 370.08–370.09, 370.11, 390.01, 250/390.11; 378/4  
See application file for complete search history.

(56) References Cited

U.S. PATENT DOCUMENTS

| | | | |
|---|---|---|---|
| 6,426,991 B1 * | 7/2002 | Mattson et al. | 378/19 |
| 6,510,195 B1 * | 1/2003 | Chappo et al. | 378/4 |
| 6,512,809 B1 * | 1/2003 | Doubrava et al. | 250/370.11 |
| 6,671,347 B1 * | 12/2003 | Tashiro et al. | 250/370.11 |
| 6,707,046 B1 * | 3/2004 | Possin et al. | 250/370.11 |
| 6,762,473 B1 * | 7/2004 | Goushcha et al. | 257/443 |
| 6,933,489 B1 * | 8/2005 | Fujii et al. | 250/214.1 |
| 2003/0122083 A1 | 7/2003 | Possin et al. | 250/370.11 |
| 2004/0113086 A1 * | 6/2004 | Heismann et al. | 250/370.09 |

OTHER PUBLICATIONS

Luhta, R. et al. "Back illuminated Photodiodes for Multislice CT". Medical Imaging 2003- Physics of Medical Imaging (Feb. 16-18, 2003), Proceedings of the International Society for Optical Engineering (SPIE), vol. 5030, pp. 235-245.*

* cited by examiner

*Primary Examiner*—David Porta  
*Assistant Examiner*—Frederick F. Rosenberger  
(74) *Attorney, Agent, or Firm*—Cantor Colburn LLP

(57) ABSTRACT

A photodiode detector assembly for use with an ionizing radiation detector, the assembly includes a first layer having a first side and a second side and an array of backlit photodiodes disposed at the second side, and a second layer disposed proximate to and opposing the second side of the first layer. The second layer includes thru vias. Light rays entering the first layer at the first side and impinging the backlit photodiodes at the second side result in electrical signals at the thru vias of the second layer, thereby providing electrical output signals from the backlit photodiodes at a distance from the backlit photodiodes.

12 Claims, 2 Drawing Sheets

APPARATUS FOR DETECTING IONIZING RADIATION

BACKGROUND OF INVENTION

The present disclosure relates generally to an ionizing radiation detector, and particularly to an ionizing radiation detector employing a backlit photodiode array.

Radiation imaging systems are widely used for medical and industrial purposes, such as for x-ray computed tomography (CT) for example. A typical detector system may comprise an array of scintillator elements attached to an array of photodiodes that are used to detect and convert ionizing radiation to light energy and then to electrical signals representative of the impinging ionizing radiation. To increase image quality, a large number of individual pixels is required, such as on the order of 1000 to 4000 individual pixels for example, with an amplifier being used for each respective pixel. As the number of individual pixels and amplifiers increases, providing the necessary signal connections for processing becomes complex and cumbersome. In an effort to resolve some of this complexity, backlit photodiode arrays have been investigated, which enables an increase in the number of photodiode detection elements in a photodiode array chip. However, backlit photodiode array chips are sensitive to electronic crosstalk, which results at least partially from the thickness of the photodiode array chip itself. Accordingly, there is a need in the art for an ionizing radiation detector arrangement that overcomes these drawbacks.

SUMMARY OF INVENTION

Embodiments disclosed herein provide a photodiode detector assembly for use with an ionizing radiation detector. The assembly includes a first layer having a first side and a second side and an array of backlit photodiodes disposed at the second side, and a second layer disposed proximate to and opposing the second side of the first layer. The second layer includes thru vias. Light rays entering the first layer at the first side and impinging the backlit photodiodes at the second side result in electrical signals at the thru vias of the second layer, thereby providing electrical output signals from the backlit photodiodes at a distance from the backlit photodiodes.

Further embodiments disclosed herein provide an ionizing radiation detector having a photodiode detector assembly and a scintillator. The photodiode detector assembly includes a first layer having a first side and a second side and an array of backlit photodiodes disposed at the second side, and a second layer disposed proximate to and opposing the second side of the first layer, the second layer having thru vias. The scintillator is disposed at the first side of the first layer and includes a radiation input surface and a radiation output surface. The scintillator produces light rays exiting at the output surface in response to radiation incident at the input surface, the light rays exiting at the output surface being incident on the first side of the first layer of the photodiode detector assembly. Light rays entering the first layer at the first side and impinging the backlit photodiodes at the second side result in electrical signals at the thru vias of the second layer, thereby providing electrical output signals from the backlit photodiodes at a distance from the backlit photodiodes.

BRIEF DESCRIPTION OF DRAWINGS

Referring to the exemplary drawings wherein like elements are numbered alike in the accompanying Figures.

DETAILED DESCRIPTION

Embodiments of the invention provide a very thin backlit photodiode detector assembly for use within an ionizing radiation detector, such as a multi-slice computed tomography (CT) x-ray detector for example. While embodiments described herein depict x-rays as exemplary ionizing radiation, it will be appreciated that the disclosed invention is also applicable to other high energy ionizing radiation, such as gamma rays, high energy electron (beta) rays, or high energy charged particles (such as those encountered in nuclear physics and space telescopes), for example. Accordingly, the disclosed invention is not limited to embodiments of x-ray detection.

Figure 1:
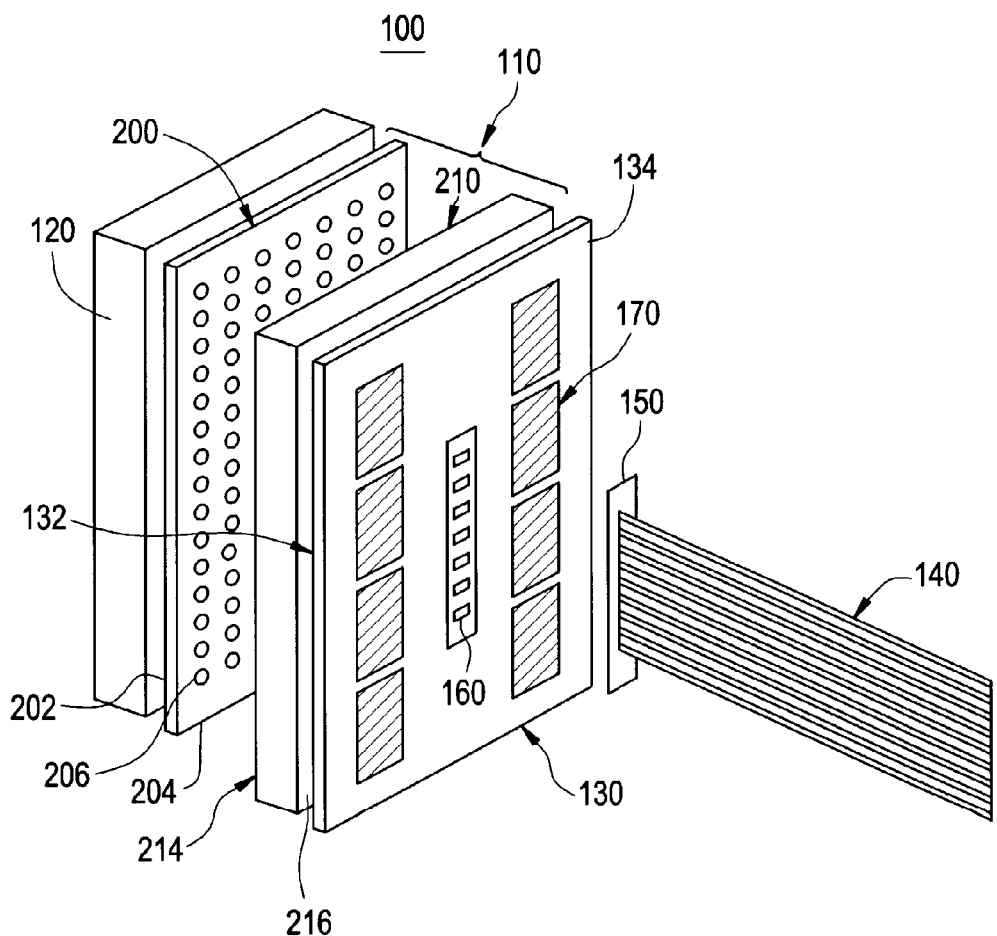
FIG. 1 depicts an exemplary multi-slice CT x-ray detector module in accordance with embodiments of the invention.

FIG. 1 is an exemplary embodiment of a multi-slice CT x-ray detector 100 having a photodiode detector assembly 110, a scintillator 120 attached to one face of assembly 110, a printed circuit board (PCB) 130 attached to another face of assembly 110, and a flex circuit 140 connected to PCB 130 via connectors 150, 160. PCB 130 may include processing chips 170.

Figure 2:
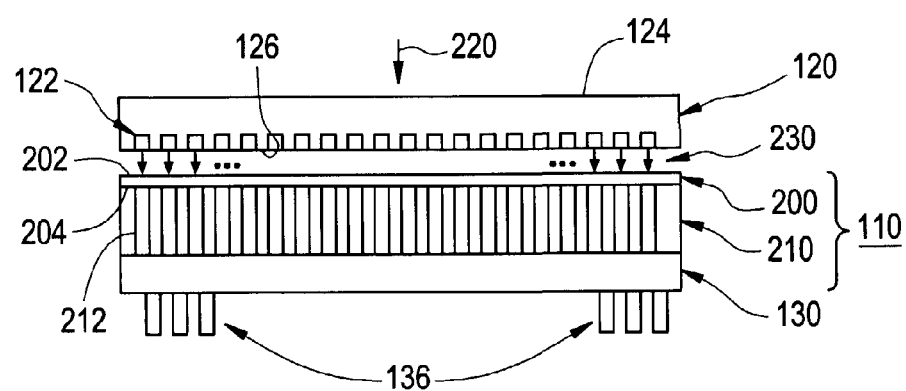
FIG. 2 depicts an end view of the detector module of FIG. 1 with some detail omitted.

Referring now to FIGS. 1 and 2 together, photodiode detector assembly 110 includes a first layer 200 having a first side 202 and a second side 204, and a second layer 210 disposed proximate to and opposing second side 204 of first layer 200. First layer 200, also referred to as a backlit photodiode array, includes an array of backlit photodiodes 206 disposed at second side 204, also referred to as the back side. Second layer 210 includes thru vias 212 for communicating an electrical signal through second layer 210.

Figure 3:
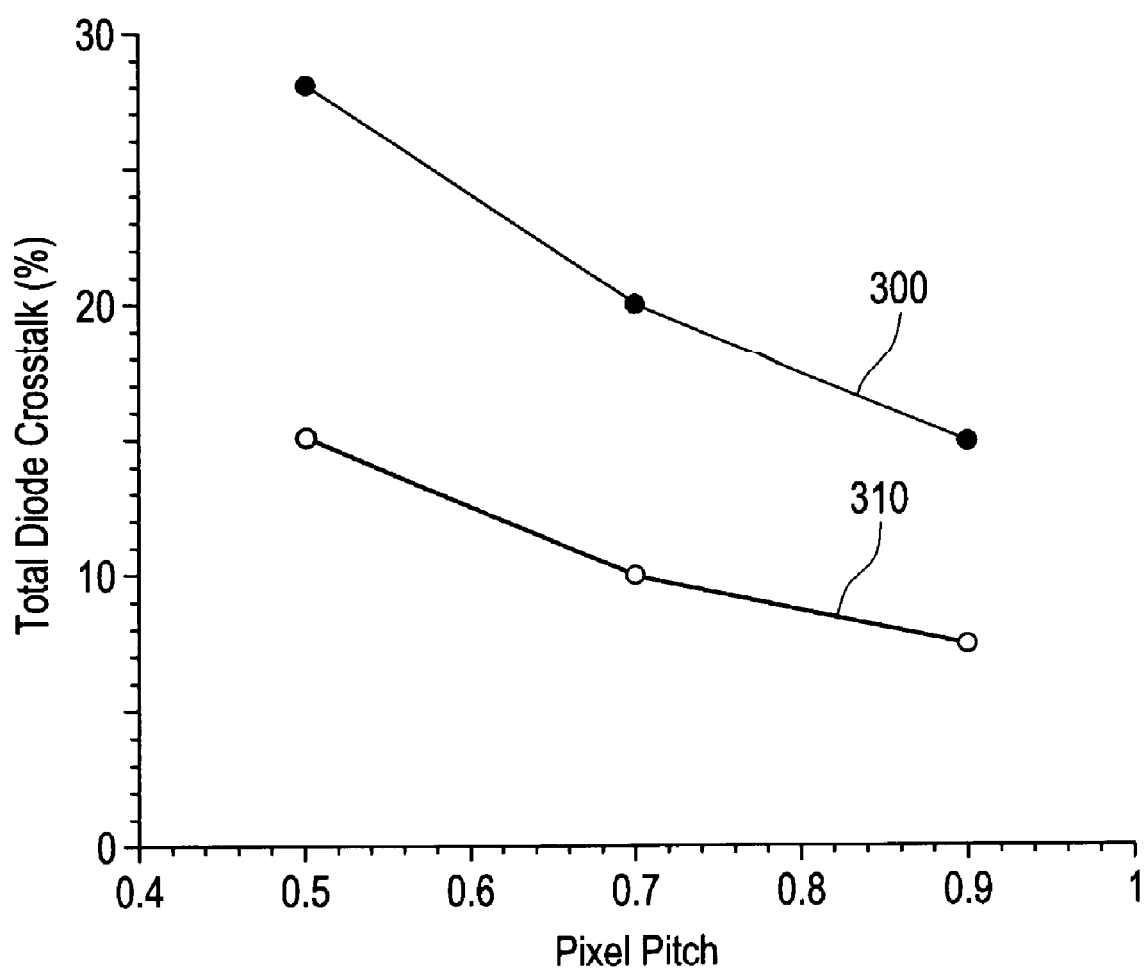
FIG. 3 is illustrative of data taken from exemplary embodiments of the invention.

In an embodiment, first layer 200 is equal to or less than about 150 microns in thickness, in another embodiment, first layer 200 is equal to or less than about 100 microns in thickness, in a further embodiment, first layer 200 is equal to or less than about 50 microns in thickness, and in yet another embodiment, first layer 200 is equal to or greater than about 25 microns in thickness. In an embodiment where first layer is equal to or less than about 150 microns and equal to or greater than about 25 microns, the cell-to-cell signal crosstalk between neighboring backlit photodiodes 206 is equal to or less than about 4%, and in an embodiment where first layer is equal to or less than about 100 microns and equal to or greater than about 25 microns, the cell-to-cell signal crosstalk between neighboring backlit photodiodes 206 is equal to or less than about 2%, as illustrated in the test data of FIG. 3. In FIG. 3, data line 300 is representative of the total signal crosstalk between one and all eight of its neighboring backlit photodiodes 206 for a silicon thickness of first layer 200 of about 150 microns, and data line 310 is representative of the total signal crosstalk between one and all eight of its neighboring backlit photodiodes 206 for a silicon thickness of first layer 200 of about 100 microns. Accordingly, the average signal crosstalk between any two neighboring backlit photodiodes 206 for a silicon thickness of first layer 200 of about 150 microns is equal to or less than about 4%, and the average signal crosstalk between any two neighboring backlit photodiodes 206 for a silicon thickness of first layer 200 of about 100 microns is equal to or less than about 2%. The signal crosstalk represented by data lines 300 and 310 in FIG. 3 are illustrated over a pixel pitch ranging from about 500 microns about 900 microns, where the pitch is taken from the leading edge of one pixel to the leading edge of another linearly arranged adjacent pixel.

In an embodiment, first and second layers 200, 210 are made from silicon, and first layer 200 is mechanically bonded and electrically connected to second layer 210. First and second layers 200, 210 may be joined using solder balls, conductive epoxy dots, cold fusion between metal pads, any other suitable method, or any combination thereof.

Scintillator 120 receives x-ray photon energy, represented by arrow 220, at a radiation input surface 124 and converts the photon energy 220 via scintillator elements 122 to light rays, represented by arrows 230, which exit scintillator 120 at a radiation output surface 126. Light rays 230 are received at first side 202 of first layer 200, transmit through first layer 200, and impinge backlit photodiodes 206 at second side 204, resulting in electrical signals at thru vias 212 of second layer 210, thereby providing electrical output signals from the backlit photodiodes 206 at a distance from second side 204 of first layer 200. In embodiment, thru vias 212 extend from a front side 214 of second layer 210 to an opposing back side 216. However, signal routing variations may be accommodated within the silicon of second layer 210, thereby providing front-to-back signal communication, front-to-edge signal communication, or any combination thereof.

As discussed previously, photodiode detector assembly 110 may have a third layer, PCB 130, attached to and in signal communication with thru vias 212 at back side 216 of second layer 210. In an embodiment, PCB 130 includes electrical connections (not shown) extending from a first board surface 132, where they connect with thru vias 212, to a second board surface 134, where they may connect with electronic components such as processing chips 170. Wire runs (not shown) on PCB 130 electrically connect processing chips 170 with connector 160, which in turn provides signal communication to flex circuit 140 via connector 150. Processing chips 170 may include data acquisition circuitry, such as amplifiers, analog-to-digital circuits, and control logic for example, to be electrically connected to, and processing output signals from, the photodiode array 206. In an alternative embodiment, low density output signal lines 136 may be employed for connecting to other electronic components (not shown). In a further alternative embodiment, a multi-layer ceramic may be utilized for PCB 130. In an exemplary embodiment, photodiode array 206 may consist of 512 photodiodes each having dimensions of about 15 millimeters (mm) by about 32 mm.

An exemplary application of backlit photodiode detector assembly 110 is in a CT x-ray detector 100 where low electronic crosstalk and high image quality is desired. The laminated arrangement of a very thin first silicon layer 200 having backlit photodiodes 206, with a second silicon layer 210 having thru vias 212, provides for the low electronic crosstalk with the high image quality while maintaining ease of material handling for subsequent assembly.

As disclosed, some embodiments of the invention may include some of the following advantages: ease of material handling during assembly of a CT x-ray detector module; high image quality of the CT output; low signal crosstalk between neighboring photodiode cells; the ability to bring signal connections out of the rear surface of the photodiode detector assembly; enabling the packaging of two-dimensional arrays of detector modules for improved patient coverage per CT rotation; and, use of a thru via silicon layer that provides a matching thermal coefficient of expansion with the photodiode array silicon layer, a mechanical stiffener for flatness, and a mechanical support for handling.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A photodiode detector assembly for use with an ionizing radiation detector, the assembly comprising:
    a first layer comprising a first side and a second side and an array of backlit photodiodes disposed at the second side; and
    a second layer disposed proximate to and opposing the second side of the first layer, the second layer comprising thru vias;
    wherein light rays entering the first layer at the first side and impinging the backlit photodiodes at the second side result in electrical signals at the thru vias of the second layer, thereby providing electrical output signals from the backlit photodiodes at a distance from to backlit photodiodes;
    wherein the first layer has a uniform thickness of equal to or less tan about 100 microns; and
    wherein the array of bandit photodiodes includes neighboring backlit photodiodes having a cell-to-cell signal crosstalk of equal to or less tan about 2% in response to the first layer having a uniform thickness of equal to or less than about 100 microns.

2. The assembly of claim 1, wherein the thickness of the first layer is equal to or less than about 50 microns.

3. The assembly of claim 1, wherein the thickness of the first layer is equal to or greater than about 25 microns.

4. The assembly of claim 1, wherein the first layer is mechanically bonded and electrically connected to the second layer.

5. The assembly of claim 4, wherein the first and the second layers each comprise silicon.

6. The assembly of claim 5, wherein the first and the second layers are joined using solder balls, conductive epoxy dots, cold fusion between metal pads, or any combination of joints comprising at least one of the foregoing.

7. The assembly of claim 1, wherein the thru vias extend from a front side of the second layer to an opposing back side of the second layer.

8. The assembly of claim 1, further comprising:
    a third layer comprising a printed circuit board having electrical connections on a first board surface that extend through to a second board surface, the electrical connections on the first board surface arranged for signal communication with the thru vias, and the electrical connections on the second board surface arranged for signal communication with at least one electronic component.

9. The assembly of claim 1, wherein the array of backlit photodiodes has a pixel pitch of equal to or greater than about 500 microns and equal to or less than about 900 microns.

10. An ionizing radiation detector, comprising:
a photodiode detector assembly comprising:
a first layer comprising a first side and a second side and an array of backlit photodiodes disposed at the second side; and
a second layer disposed proximate to and opposing the second side of the first layer, the second layer comprising tin vias; and
a scintillator disposed at the first side of the first layer, the scintillator comprising:
a radiation input surface and a radiation output surface wherein the scintillator produces light rays exiting at the output surface in response to radiation incident at the input surface, the light rays exiting at the output surface being incident on the first side of the first layer of the photodiode detector assembly;
wherein light rays entering the first layer at the first side and impinging the back-lit photodiodes at the second side result in electrical signals at the thru vias of the second layer, thereby providing electrical output signals from the back-lit photodiodes at a distance from the backlit photodiodes;
wherein the thickness of the first layer is equal to or greater than about 25 microns and equal to or less than about 100 microns; and
wherein the array of backlit photodiodes includes neighboring backlit photodiodes having a cell-to-cell signal crosstalk of equal to or less than about 2% in response to the first layer having a uniform thickness of equal to or less than about 100 microns.

11. The detector of claim 10, wherein the first and the second layers each comprise silicon and the first layer is mechanically bonded and electrically connected to the second layer.

12. The detector of claim 10, wherein the flint vias extend from a front side of the second layer to an opposing back side of the second layer, and further comprising:
a third layer comprising a printed circuit board having electrical connections on a first board surface that extend through to a second board surface, the electrical connections on the first board surface arranged for signal communication with the thru vias, and the electrical connections on the second board surface ranged for signal communication with at least one electronic component.

* * * * *

UNITED STATES PATENT AND TRADEMARK OFFICE
CERTIFICATE OF CORRECTION

PATENT NO. : 7,075,091 B2 Page 1 of 1
APPLICATION NO. : 10/707984
DATED : July 11, 2006
INVENTOR(S) : David Michael Hoffman It is certified that error appears in the above-identified patent and that said Letters Patent is hereby corrected as shown below:

Column 3:
Line 4, after "microns" insert -- to --

Column 4:
Line 40, after "of" delete "bandit" and insert therefor -- backlit --

Column 5:
Line 26, after "the" delete "back-lit" and insert therefor -- backlit --
Line 29, after "the" delete "back-lit" and insert therefor -- backlit --

Column 6:
Line 14, after "the" delete "flint" and insert therefor -- thru --
Line 22, after "surface" delete "ranged" and insert therefor -- arranged --

Signed and Sealed this

Sixteenth Day of January, 2007

JON W. DUDAS
*Director of the United States Patent and Trademark Office*